United States Patent
Ker et al.

(10) Patent No.: US 6,885,529 B2
(45) Date of Patent: Apr. 26, 2005

(54) CDM ESD PROTECTION DESIGN USING DEEP N-WELL STRUCTURE

(75) Inventors: Ming-Dou Ker, Hsinchu (TW); Hun-Hsien Chang, Taipei Hsien (TW); Wen-Tai Wang, Taipei (TW)

(73) Assignee: Taiwan Semiconductor Manufacturing Co., Limited, Hsin-Chu (TW)

( * ) Notice: Subject to any disclaimer, the term of this patent is extended or adjusted under 35 U.S.C. 154(b) by 488 days.

(21) Appl. No.: 09/942,785

(22) Filed: Aug. 31, 2001

(65) Prior Publication Data

US 2002/0181177 A1 Dec. 5, 2002

(30) Foreign Application Priority Data

May 29, 2001 (TW) .......................................... 90112894 A

(51) Int. Cl.$^7$ .............................. H02H 3/22; H02H 9/00
(52) U.S. Cl. ......................................... 361/56; 361/111
(58) Field of Search .......................... 361/56, 111, 91.1, 361/91.7; 257/357

(56) References Cited

U.S. PATENT DOCUMENTS

| | | | | |
|---|---|---|---|---|
| 4,782,250 A | * | 11/1988 | Adams et al. ............... | 327/108 |
| 5,287,241 A | * | 2/1994 | Puar ............................ | 361/56 |
| 5,477,413 A | * | 12/1995 | Watt ............................. | 361/56 |
| 5,530,612 A | * | 6/1996 | Maloney ...................... | 361/56 |
| 5,729,419 A | | 3/1998 | Lien | |
| 5,901,022 A | | 5/1999 | Ker | |
| 5,917,220 A | * | 6/1999 | Waggoner .................... | 257/360 |
| 6,046,897 A | * | 4/2000 | Smith et al. ................. | 361/111 |
| 6,049,119 A | * | 4/2000 | Smith .......................... | 257/575 |
| 6,184,557 B1 | * | 2/2001 | Poplevine et al. ........... | 257/358 |
| 6,594,132 B1 | * | 7/2003 | Avery .......................... | 361/111 |

\* cited by examiner

*Primary Examiner*—Brian Sircus
(74) *Attorney, Agent, or Firm*—Birch, Stewart, Kolasch & Birch, LLP.

(57) ABSTRACT

An object of the present invention is to provide a charged-device model (CDM) electrostatic discharge (ESD) protection circuit for an integrated circuit (IC). The ESD protection circuit comprises an ESD clamp device and a functional component. The ESD clamp device is coupled to a pad and a substrate having a first conductivity type. Under normal power operation, the ESD clamp device is closed. The functional component is formed on the substrate and coupled to the pad. The functional component has a first well having the first conductivity type and an isolating region having a second conductivity type for isolating the first well from the substrate. Under normal power operation, the functional component transmits signals between the IC and an external linkage. During an CDM ESD event, the CDM charges accumulated in the substrate are discharged via the ESD clamp circuit. Hence, the functional component is protected.

22 Claims, 15 Drawing Sheets

CDM ESD PROTECTION DESIGN USING DEEP N-WELL STRUCTURE

BACKGROUND OF THE INVENTION

1. Field of the Invention

The present invention relates in general to a charged-device-model (CDM) electrostatic discharge (ESD) protection device, and especially to a CDM ESD protection device using deep N-well structure.

2. Description of the Related Art

ESD protection circuits are generally known to protect integrated circuits (IC) from machine model (MM) or human body model (HBM) electrostatic discharge events. In an HBM or MM mode electrostatic discharge event, electrostatic charges enter the IC through some of the IC pins and exit through others. To protect IC from such ESD events, an ESD protection circuit is often disposed adjacent to the output or input pad of the IC circuit to discharge the ESD stress. As the conventional ESD protection circuit shows in FIG. 1, the components of the input buffer 12 are protected against ESD events. The two-stage ESD protection circuit 10 has a secondary ESD protection circuit 14, a primary ESD protection circuit 16 and a resistor R. The secondary ESD protection circuit 14 clamps the electrostatic stress across the input buffer 12; and the primary ESD protection circuit 16 discharges the electrostatic stress. Via proper design, the input buffer 12 is effectively protected from the HMB and MM ESD events.

Apart from the HMB and MM ESD events described, another ESD type referred to is charged-device model (CDM). In a CDM ESD event, electrostatic charges are stored in a floating IC substrate and are discharged via the momentarily grounded pins. Unlike HBD or MM ESD events, the ESD charges of a CMD ESD event are stored in the IC substrate, not relying on an external source. For instance, electrostatic charges accumulate in the IC via friction generated during IC conveyance. When one or more pins of the IC are momentarily grounded to a grounded platform, the electrostatic charges are discharged through the grounded pins.

The schematic diagrams of IC with the positive and the negative charges in a floating substrate are respectively shown in FIGS. 2 and 3. Because the IC is in a floating state, the accumulated electrostatic charges (as the positive charges 11 in FIG. 2 and the negative charges 13 in FIG. 3), due to the repelling characteristics of equal polarity, distribute evenly on the IC or IC substrate 20. The components of IC are usually only several micrometers thick on the wafer surface. For example, in a 0.35 micrometer CMOS process, the N-type or P-type well 22 is only about 2 micrometers thick, the N+ diffusion 26 and the P+ diffusion 24 is about 0.2 micrometer thick only. The substrate 20 has a much greater thickness, about 500~600 micrometers, depending on the overall wafer thickness. Therefore, the majority of the electrostatic charges are accumulated in the substrate 20 of the IC, as shown in FIGS. 2 and 3.

CDM ESD stress often breaks through the gate oxide layers of input buffers. The substrate is filled with a substantial amount of electrostatic charges which transiently cause overstress and breakdown of the gate oxide of the input buffers. $I_{ESD}$ in FIGS. 2 and 3 represents the schematic CDM ESD current path. The schematic equivalent circuit diagram of the discharge operation is shown in FIG. 4. Although an ESD protection circuit 10 is added beside the input pad 18 connected to the input buffer, the gate oxide 30 of the input buffer is still easily broken down in a CDM ESD event. Because the CDM charges 32 are initially stored in the IC substrate, the ESD protection circuit 10 beside the input pad 18 cannot discharge the CDM charges as quickly as in a HMB or MM event wherein the electrostatic charges are provided externally. Conventional ESD protection circuits endure high HMB or MM ESD stress, but cannot cope with this CDM ESD stress.

A conventional method solves the problems caused by CDM ESD events by adding a small gate-grounded NMOS bedside the gate of the input buffer. The ground line VSS connected to the small gate-grounded NMOS is also the ground line of the input buffer as shown in FIG. 5, the schematic CDM ESD protection circuit diagram, wherein Mn1$b$ and Mp1$a$ are small gate-grounded MOS for clamping the CDM ESD stress across the gate of the input buffer. The other CDM ESD protection design is shown in FIG. 6, wherein two small diodes (Dp and Dn) are used to clamp the CDM ESD stress across the gate of the input buffer. In both cases, the added components Mp1$a$, Mn1$b$ or Dp, Dn have to be formed inside the IC along with the input buffer to effectively protect the IC from CDM ESD stress. Such a design, on the other hand, produces IC more susceptible to the latch-up effect.

The other conventional method to solve the CDM ESD problem is to dispose the input buffer beside the pad so that the gate oxide of input buffer is protected by the HMB/MM ESD protection circuit near the pad. However, this will increase the layout complexity of the circuit around the pad.

In U.S. Pat. No. 5,901,022, an inductor is added between the input pad and the HBM/MM ESD protection circuit to clamp the CDM ESD stress across the gate oxide of the input buffer.

In U.S. Pat. No. 5,729,419, a CDM ESD protection circuit is proposed for the output buffer to clamp the voltage across the gate oxide of the output buffer.

SUMMARY OF THE INVENTION

An object of the present invention is to provide a charged-device model (CDM) electrostatic discharge (ESD) protection circuit for an integrated circuit (IC). The ESD protection circuit comprises an ESD clamp device and a functional component. The ESD clamp device is coupled to a pad and a substrate having a first conductivity type. Under normal power operation, the ESD clamp device is closed. The functional component is formed on the substrate and coupled to the pad. The functional component has a first well having the first conductivity type and an isolating region having a second conductivity type; the second conductivity type is the reversed polarity of the first conductivity type; and the isolating region has isolated the first well from the substrate. Under normal power operation, the functional component transmits signals between the IC and an external linkage.

The first and the second conductivity types can be either N type or P type.

The ESD clamp device can be a two-stage HBM ESD protection circuit. The functional component can be an MOS component of either an input buffer or a output driver. The isolating region having the second conductivity type comprises a second well surrounding the first well and a deep well under the first well.

The first well and the substrate are isolated by the deep well of the reversed conductivity type.

The electrostatic charges accumulated in the first well are much lower than those accumulated in the substrate. During an ESD event, the substantial amount of electrostatic charges isolated by the isolating well are discharged through the ESD clamp circuit to the pad, not through the functional component. The electrostatic charges in the first well are too few to damage the functional component. Therefore, the functional component is less susceptible to damages caused by CDM ESD.

The present invention provides another CDM ESD protection circuit for an input buffer of an IC. The ESD protection circuit comprises: an ESD clamp device and an MOS component.

The ESD clamp device is coupled to a pad and a substrate having the first conductivity type. Under normal power operation, the ESD clamp device is closed. The MOS component is a second conductivity type, formed in a first well on the substrate and having a gate coupled to the pad. An isolating region having the second conductivity type is formed between the first well and the substrate to separate the two; and the second conductivity type is the reversed polarity of the first conductive type. Under normal power operation, the MOS component transmits a signal from the pad into the IC.

The present invention further provides a CDM ESD protection circuit for an output port of an IC. The ESD protection circuit comprises: an ESD clamp device and an MOS component. The ESD clamp device is coupled to a pad and a substrate having the first conductivity type. Under normal power operation, the ESD clamp device is closed. The MOS component is a second conductivity type, and is formed in a first well on the substrate and coupled to the pad. An isolating region having the second conductivity type is formed between the first well and the substrate to separate the first well and the substrate; the second conductivity type is the reversed polarity of the first conductive type; under normal power operation, the MOS component transmits a signal from the IC to the pad.

The present invention yet provides a CDM ESD protection circuit, suitable for an I/O port of a mixed-voltage IC. The CDM ESD protection circuit comprises: an ESD clamp device, first NMOS (N-type metal-on-semiconductor) component, and an output driver. The ESD clamp device is coupled between a pad and a p-type substrate. Under normal power operation, the ESD clamp device is closed. The first NMOS component is formed on a first isolated well. An isolating region is formed to separate the first isolated well and the substrate; the first NMOS component has a gate coupled to a high power line, a first source/drain coupled the pad, and a second source/drain coupled to an input buffer. The output driver comprises a second and a third NMOS components respectively formed in a second isolated well on the P-type substrate and connected in series. An N-type first isolating region is formed between the second isolated well and the P-type substrate; a gate of the second NMOS component is coupled to the high power line, a drain of the second NMOS component is coupled to the pad, a source of the second NMOS component is coupled to a drain of the third NMOS component; a source of the third NMOS component is coupled to an I/O low power line, and a gate of the third NMOS component is coupled to a pre-output driver.

The advantage of the present invention is that by using an isolating region, most of the significant electrostatic charges stored in the substrate are discharged through the ESD clamp circuit, rather than through the functioning component, to the pad. Additionally, the electrostatic charges in the first well is too few to damage the gate oxide of the functioning component.

As technology of deep sub-micron CMOS advances, IC products often have high-integration circuit blocks, such as embedded dynamic random-access-memory (DRAM)or mixed-mode circuits (analog circuit blocks). In order to maintain the circuit performance of the embedded DRAM or mixed-mode (analogue) circuits, or to reduce noise coupling through common p-type substrate, a deep N-well structure is often added into the CMOS processes to meet the required circuit specifications. Especially, the memory cells of the embedded DRAM are placed in a stand-alone p-well region which is isolated from the common p-type substrate by a deep N-well structure. The common p-type substrate is generally biased at 0V (ground) for most of the applications. With the addition of the deep N-well structure, the stand-alone p-well region can be biased with a negative voltage level to reduce the leakage current of the switch MOS in the memory cell. In the mixed-mode circuit, the high-resolution circuit performance of the analog circuits is easily disturbed by noises generated from the digital logic blocks. With the additional deep N-well structure in the CMOS technology, the NMOS devices of analog circuits are placed at the isolated p-well region, which is isolated from the noisy common p-substrate. Therefore, the deep N-well structure has been generally included into the sub-micron CMOS process to support the IC design for high-integration applications.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
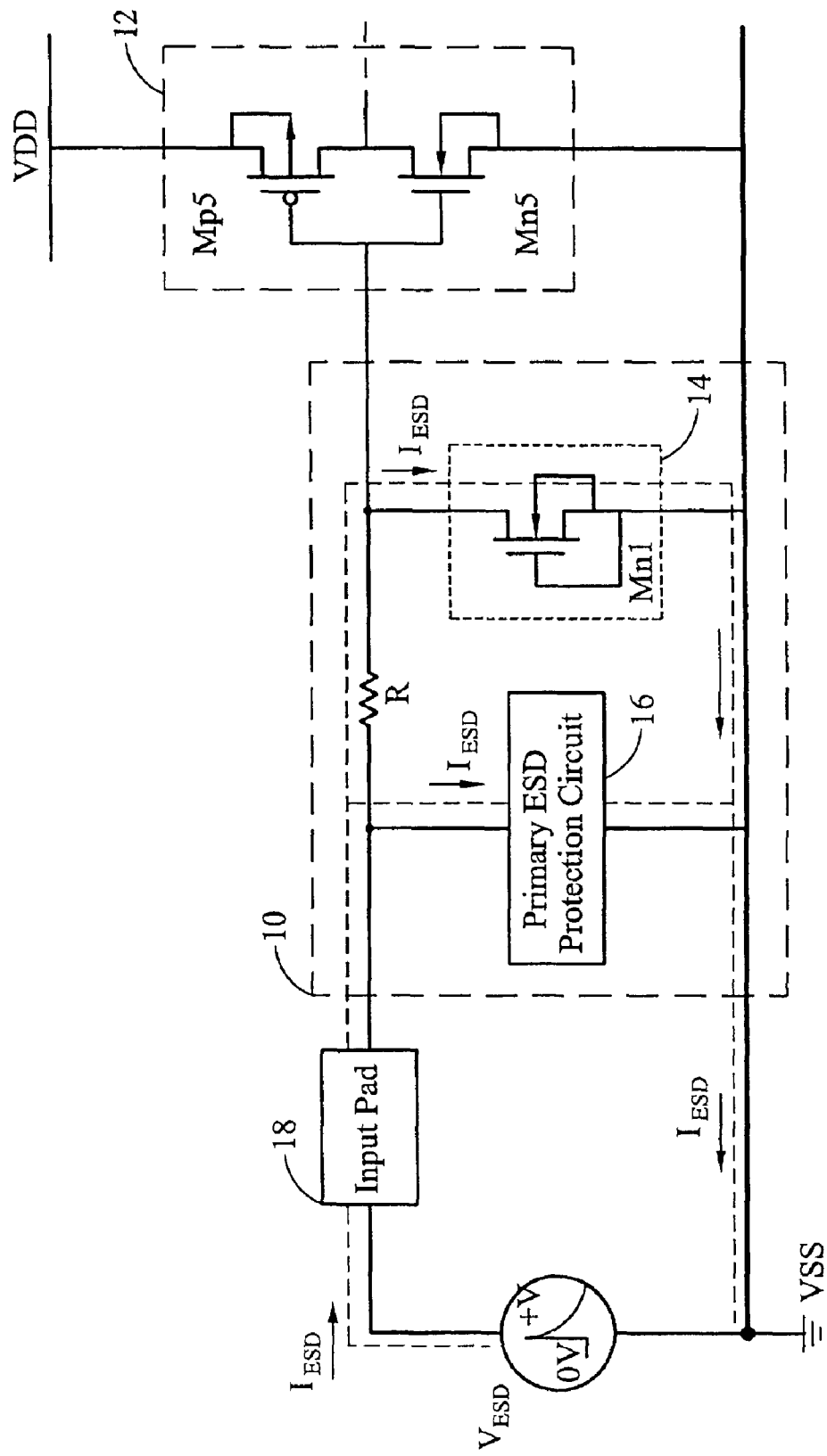
FIG. 1 is a diagram of a conventional ESD protection circuit.
Figure 2:
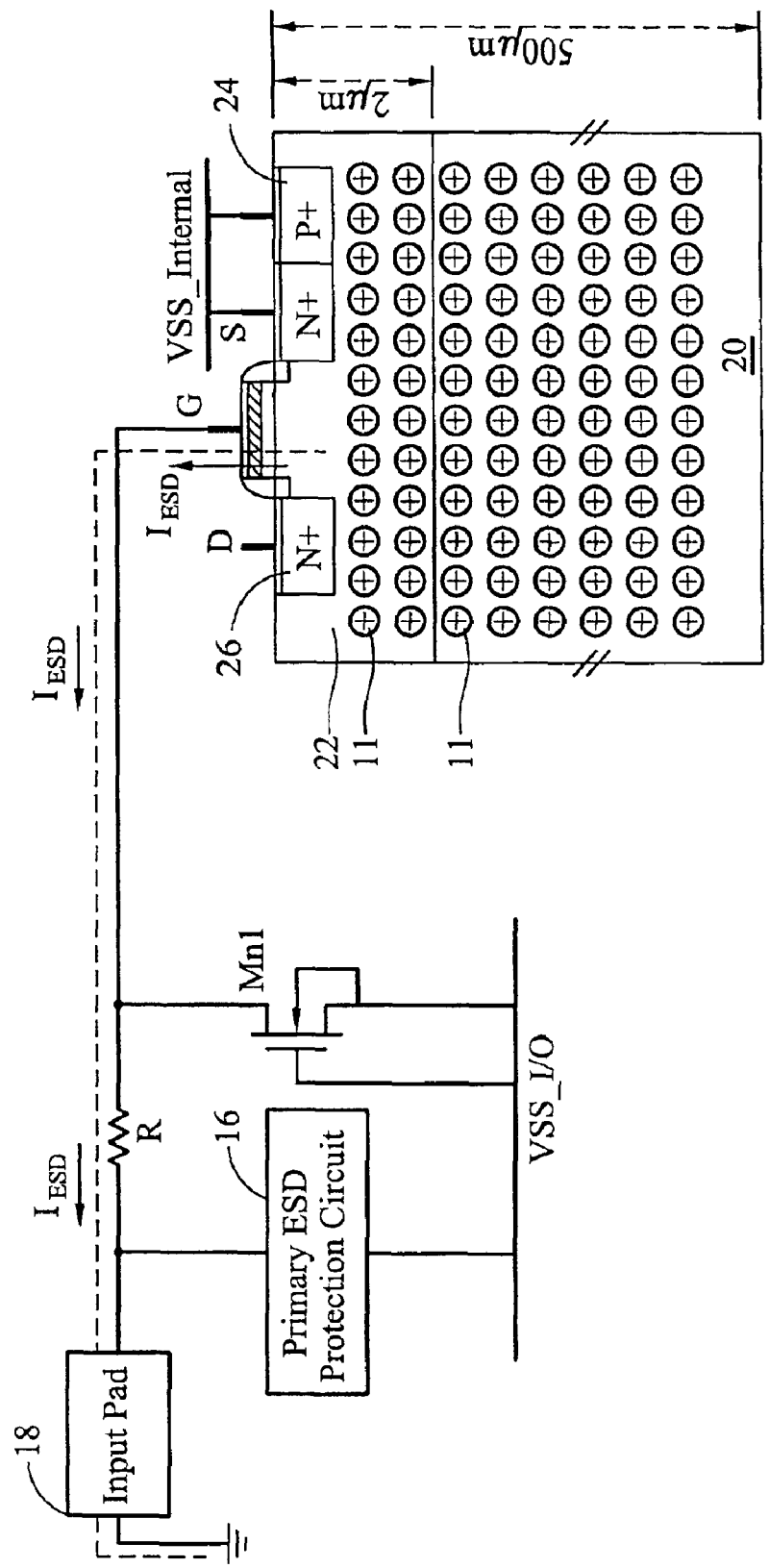
FIG. 2 shows a schematic IC diagram with positive charges accumulating in the floating substrate.
Figure 3:
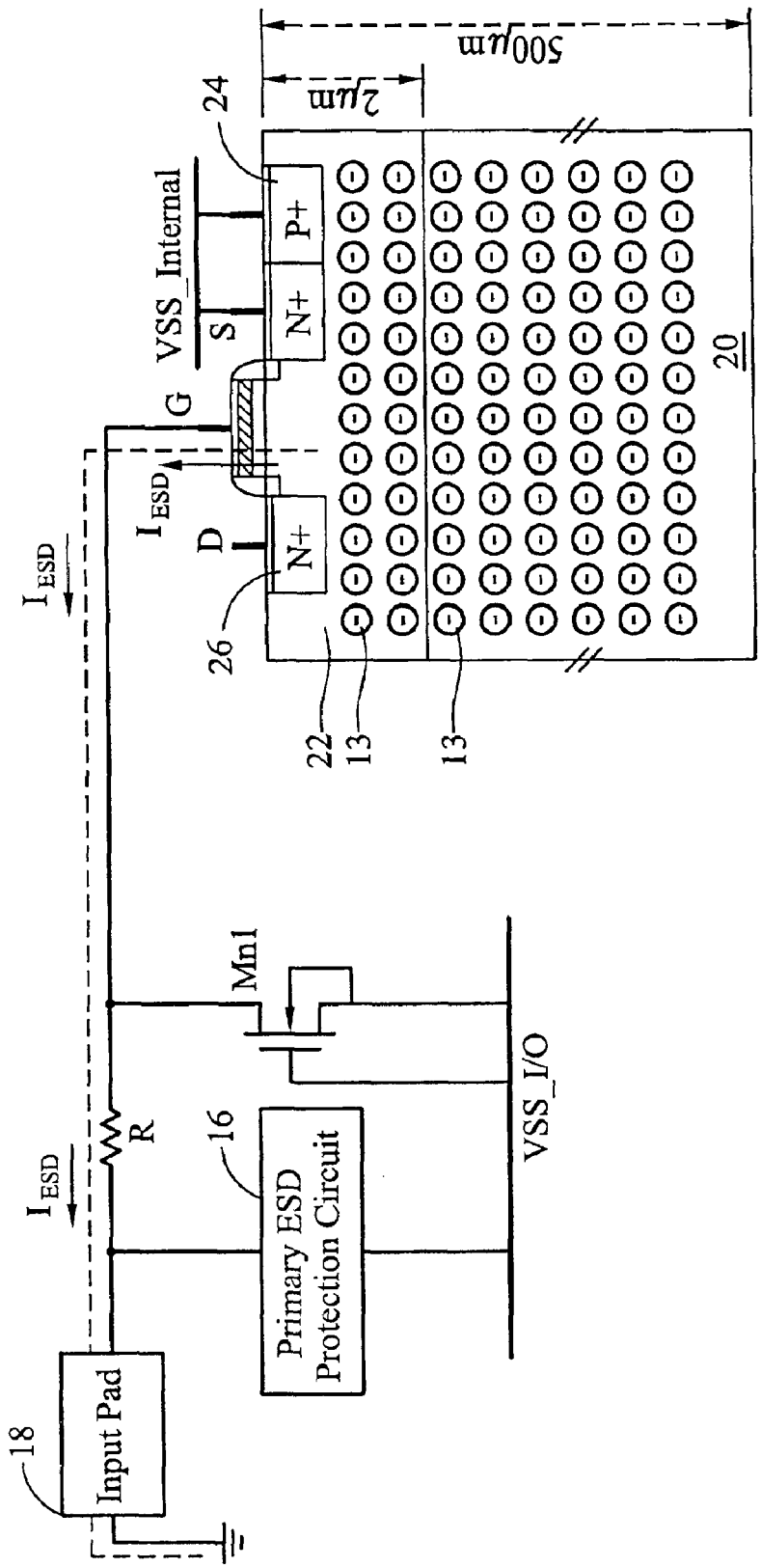
FIG. 3 shows a schematic IC diagram with negative charges accumulating in the floating substrate.
Figure 4:
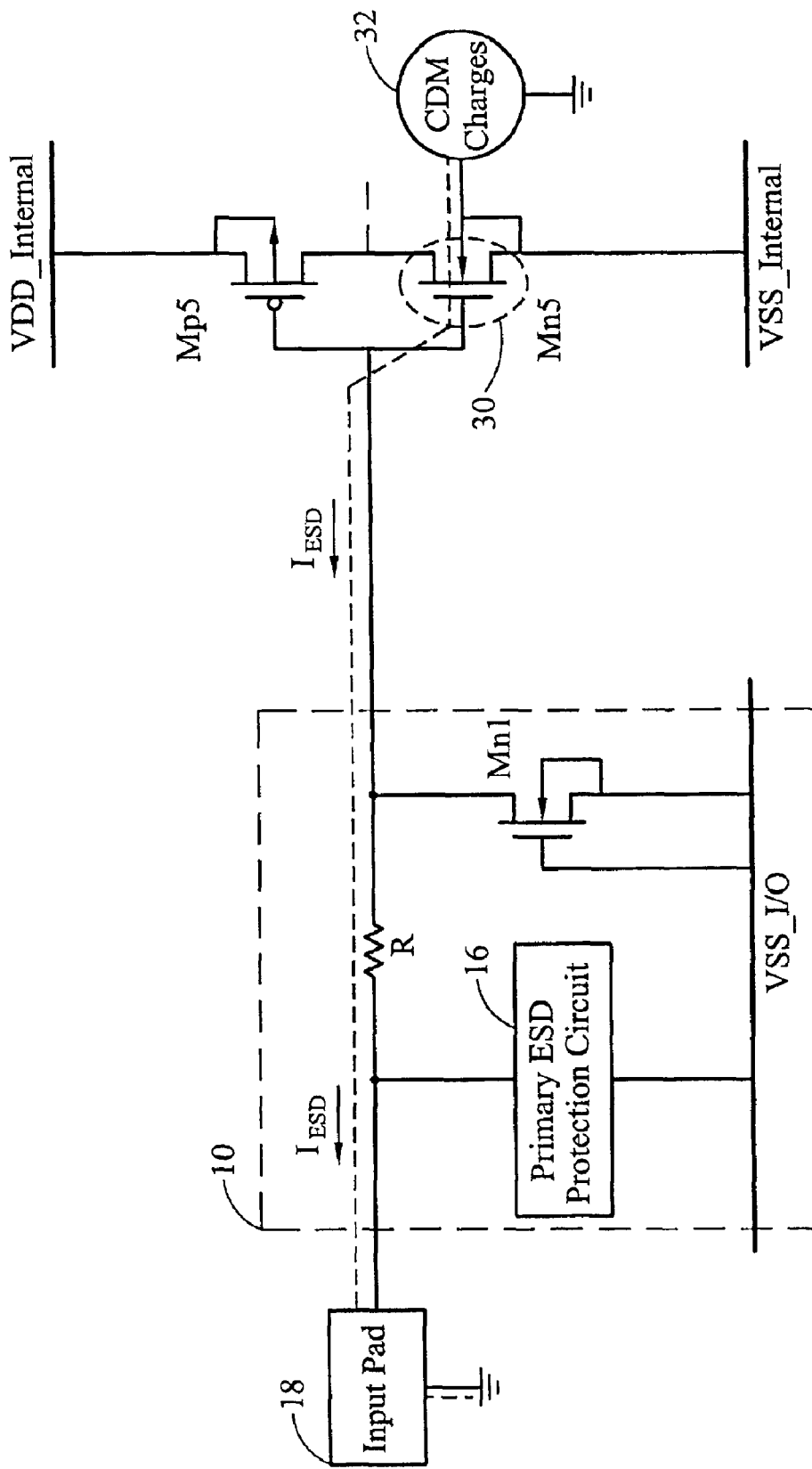
FIG. 4 shows a schematic equivalent circuit diagram of the discharge phenomenon in FIGS. 2 and 3.
Figure 5:
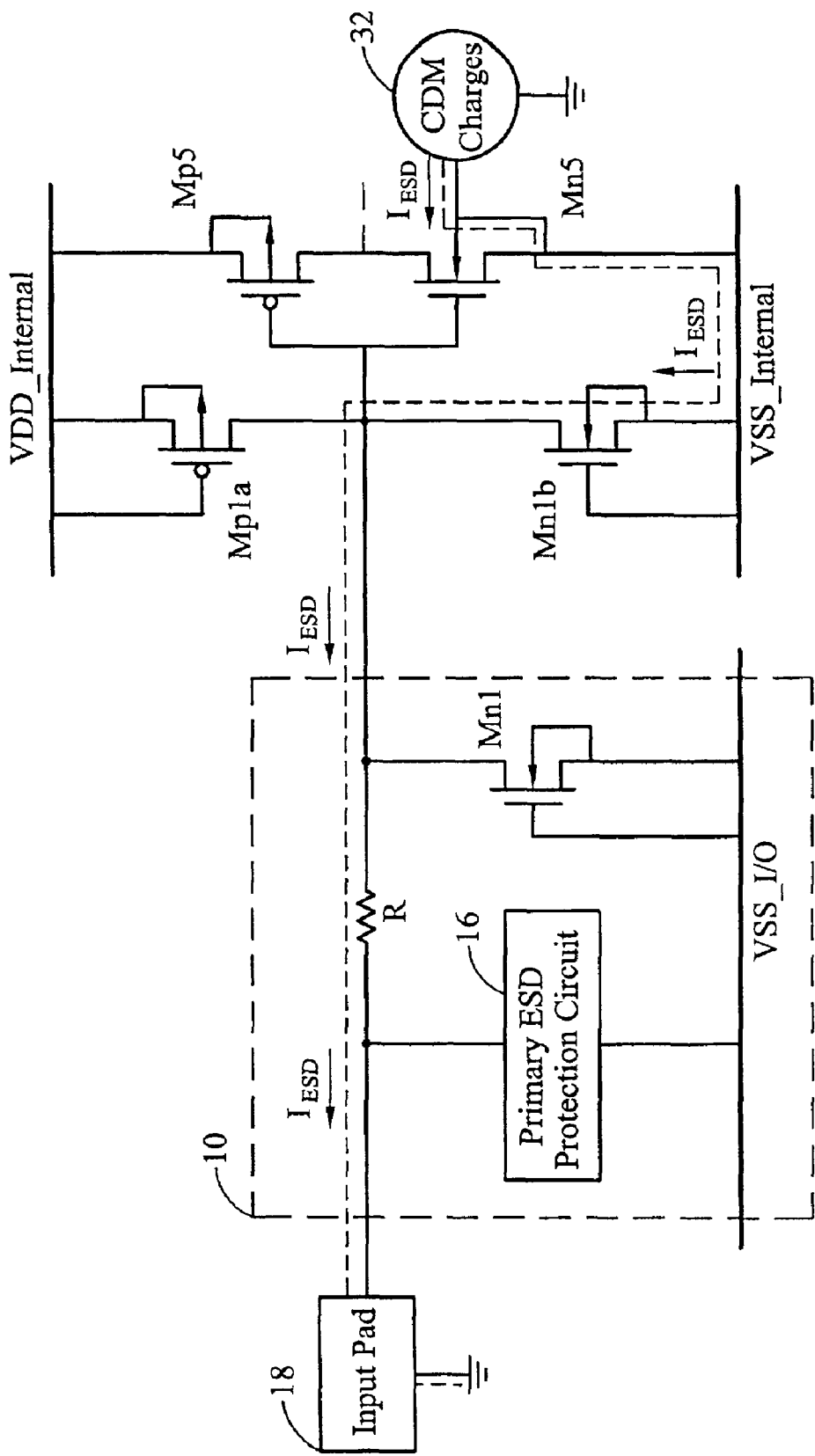
FIG. 5 is a perspective diagram of another conventional CDM ESD protection circuit.
Figure 6:
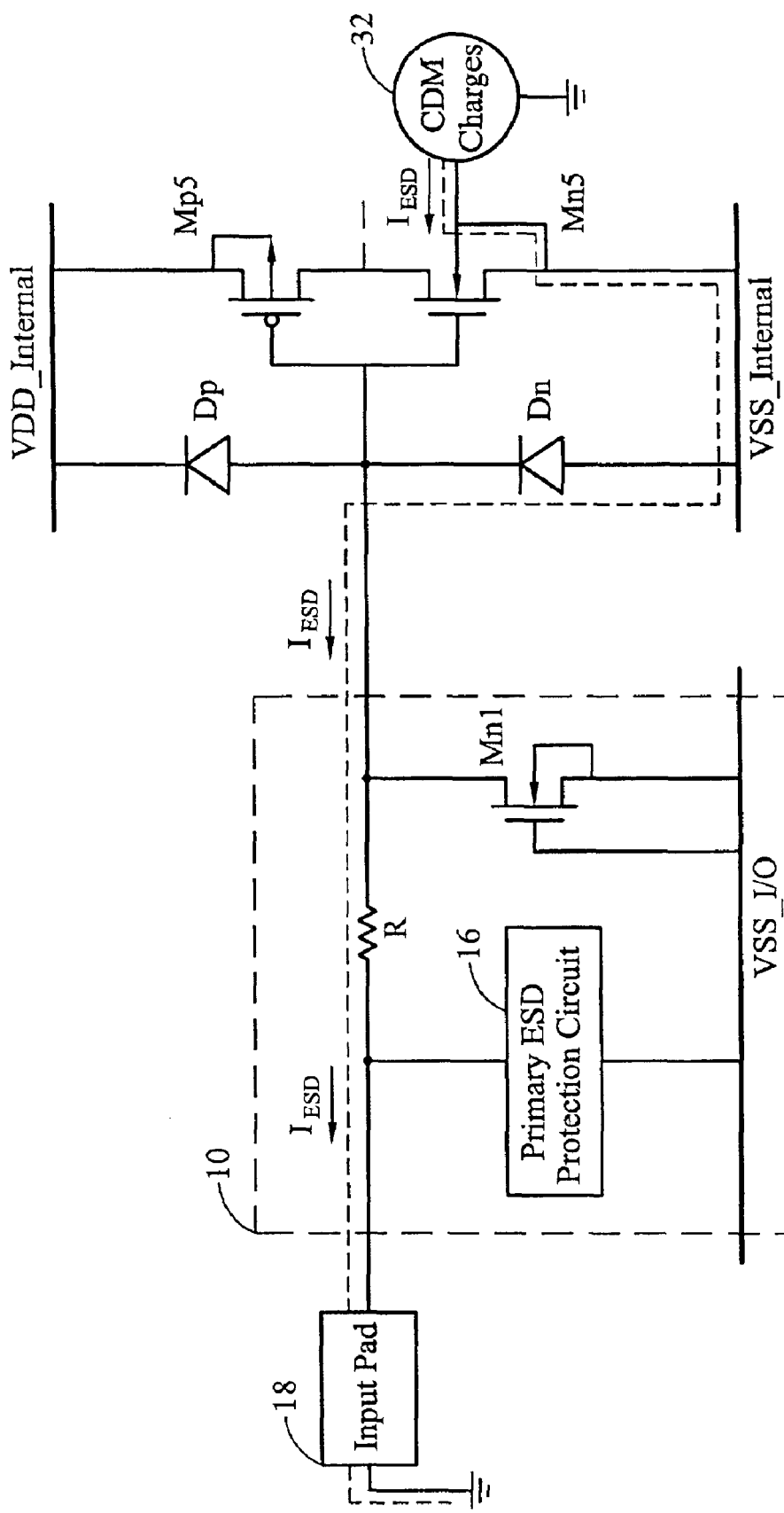
FIG. 6 is a perspective diagram of yet another conventional CDM ESD protection circuit.
Figure 7:
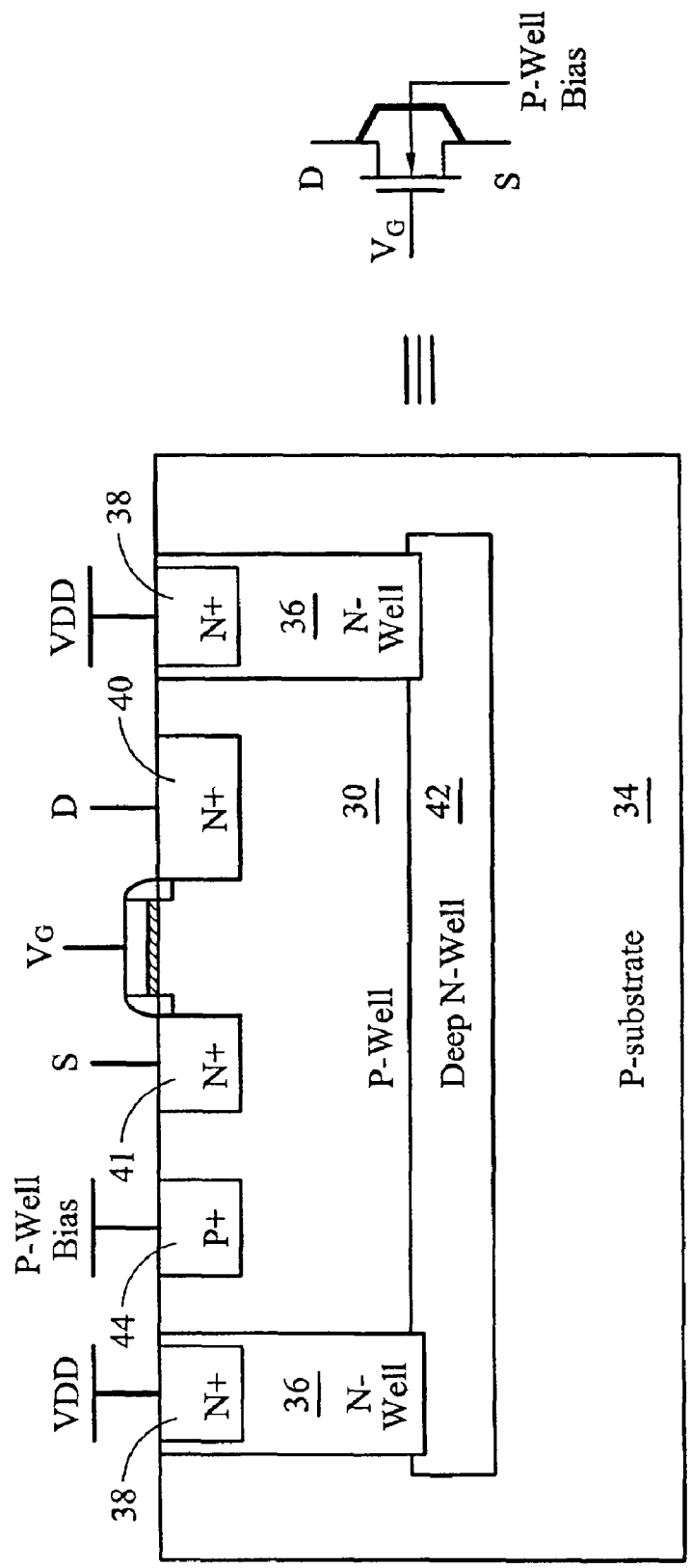
FIG. 7 is a sectional view of an NMOS component with a deep N-well structure of the present invention and the denoted symbol thereof.

With the additional deep N-well structure as described in the prior art, an ESD protection design for overcoming the CDM ESD events is proposed in this invention. An ESD protection design using a deep N-well for overcoming CDM ESD events is proposed in the present invention. A cross-section of the NMOS component placed in an isolated p-well region with the deep N-well structure and the symbol thereof is shown in FIG. 7. The symbol shown in the right-hand side of the FIG. 7 will be used in the following section to show the ESD protection design against CDM ESD events. In FIG. 7, the stand-alone p-well 30 is isolated from the common substrate 34. The p-well 30 is coupled to VSS. The whole p-well region 30 is surrounded by a normal N-well 36 at the edge and a deep N-well 42 at the bottom. The N-well 36 the deep N-well 42 are biased at VDD via a N+ diffusion region 38. The stand-along p-well 30 is biased at a fixed voltage level, which, depending on the circuit design, is often a clear ground in the analogue circuits or a negative voltage level in the DRAM memory cells.

Figure 8:
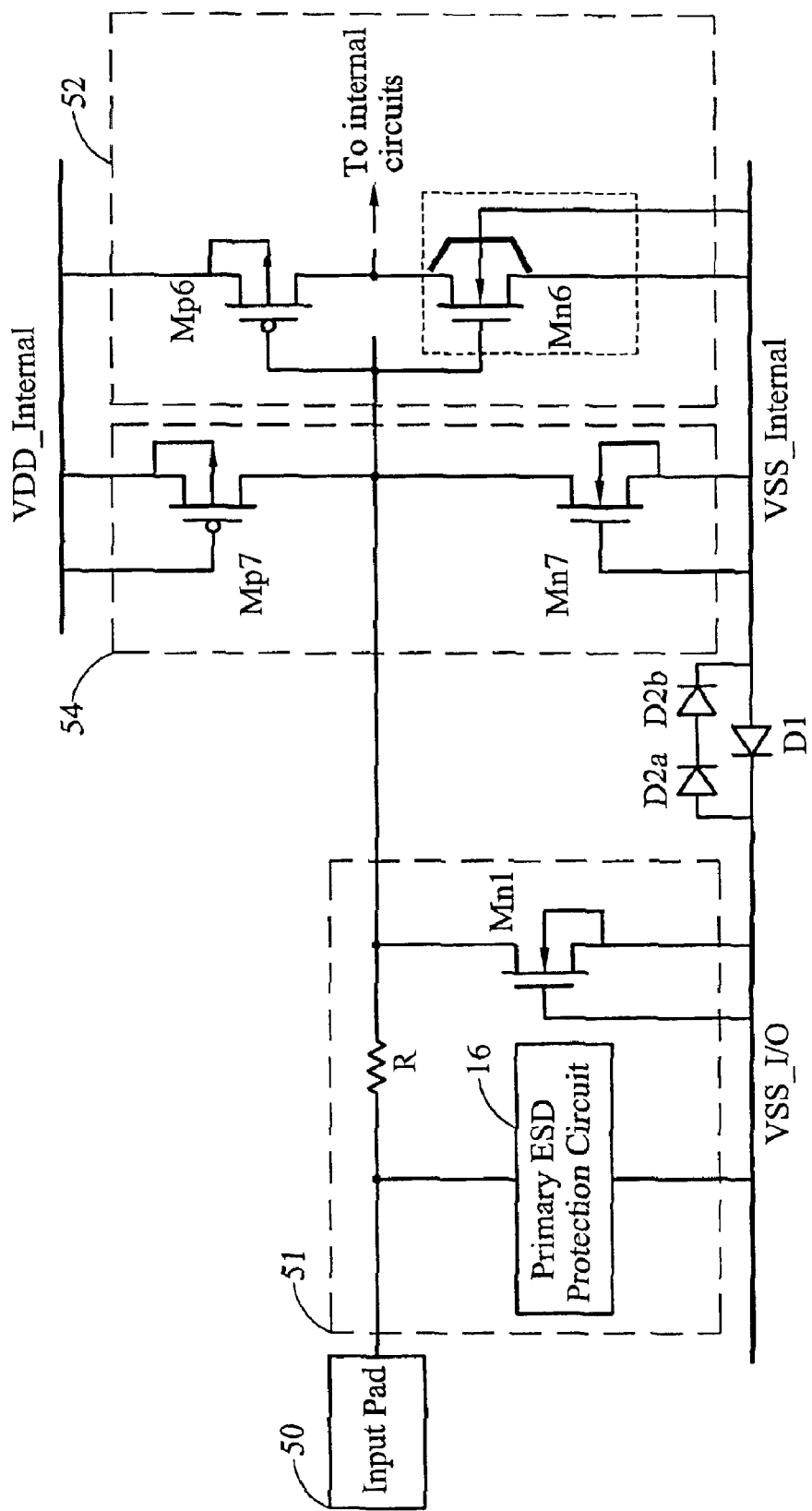
FIG. 8 is a schematic diagram of a CDM ESD protection circuit designed for an input port.

With the deep N-well design in FIG. 7, the CDM ESD protection design of this invention for the input pad is shown in FIG. 8. The CDM ESD protection design of this invention for the output pad is shown in FIG. 9.

In FIG. 8, the input buffer 52 is comprised of a PMOS Mp6 and an NMOS Mn6. The gate of both Mp6 and Mn6 are coupled to an input pad 50. The ESD clamp device 54 of the input buffer 52 comprises an NMOS Mn7 and a PMOS Mp7. The NMOS (Mn6) of input buffer 52 has the deep N-well structure, but Mn7 in the CDM ESD clamp device 54 does not. Therefore, the P-well of Mn6 is isolated from the common P-substrate, but the P-well of Mn7 is connected to the common P-substrate. There are a plurality of diodes added between the VSS_I/O and VSS_internal power lines to provide the ESD current path for CDM events. As explained, CDM ESD failures are often located at the gate oxide of NMOS of input buffer 52. In FIG. 8, the NMOS Mn6 of input buffer 52 is placed in the stand-along P-well which is isolated from the common P-substrate. Therefore, the CDM charges originally stored in the P-substrate are difficult to discharge through the gate oxide of Mn6 component, because the P-N junction between the deep N-well and the P-substrate or between the deep N-well and the stand-alone P-well often have a much higher breakdown voltage level. Mn7 in FIG. 8 has a P-well directly connected to the P-substrate, without the obstruction of the deep N-well structure. In comparison, Mn7 has a lower breakdown voltage (from the P-substrate to its drain N+ diffusion) so that the CDM charges stored in the P-substrate body are discharged through Mn7 to the pad 50. The gate oxide of input buffer 52 is thus protected from overstress damage.

Figure 9:
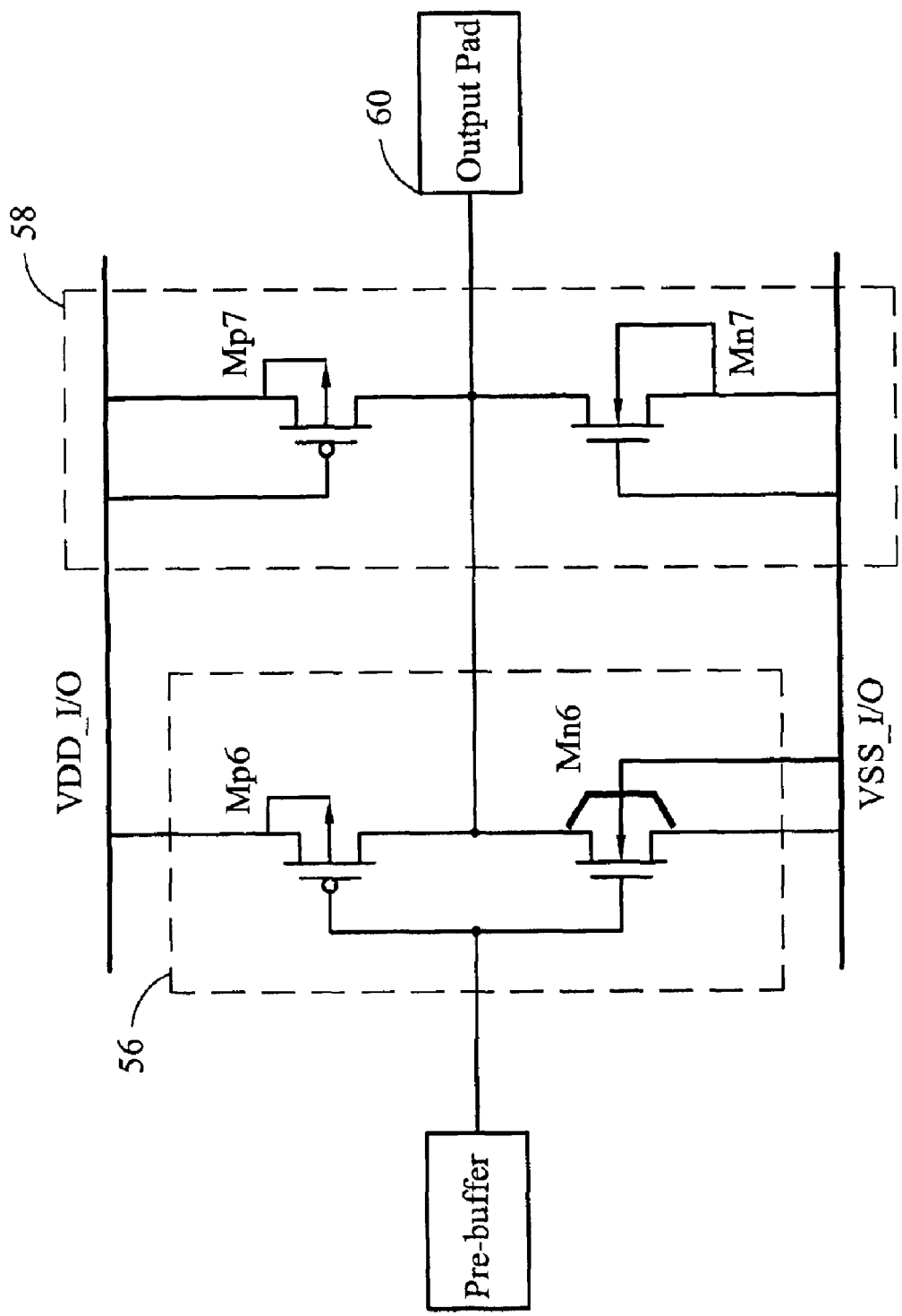
FIG. 9 is a schematic diagram of a CDM ESD protection circuit designed for an output pad.

Similarly, in the output circuit in FIG. 9, the NMOS Mn6 of the output driver 56 has the deep N-well structure, but Mn7 of the ESD clamp device 58 has no deep N-well structure. With the deep N-well structure, Mn6 in FIG. 9 has a much higher breakdown voltage from the substrate to its drain region (connected to the output pad 60) than that of the ESD clamp component Mn7. So, the CDM charges stored in the P-substrate is discharged through the drain of Mn7 to the output pad 60. The output ESD clamp component Mn7 is often designed with a larger device dimension (typically has a channel width of 200 μm~300 μm) to sustain the desired ESD-stress level. By using the design of the deep N-well structure, the functional output device component Mn6 can be fully protected by the output ESD clamp component Mn7 against the CDM ESD events.

Figure 10:
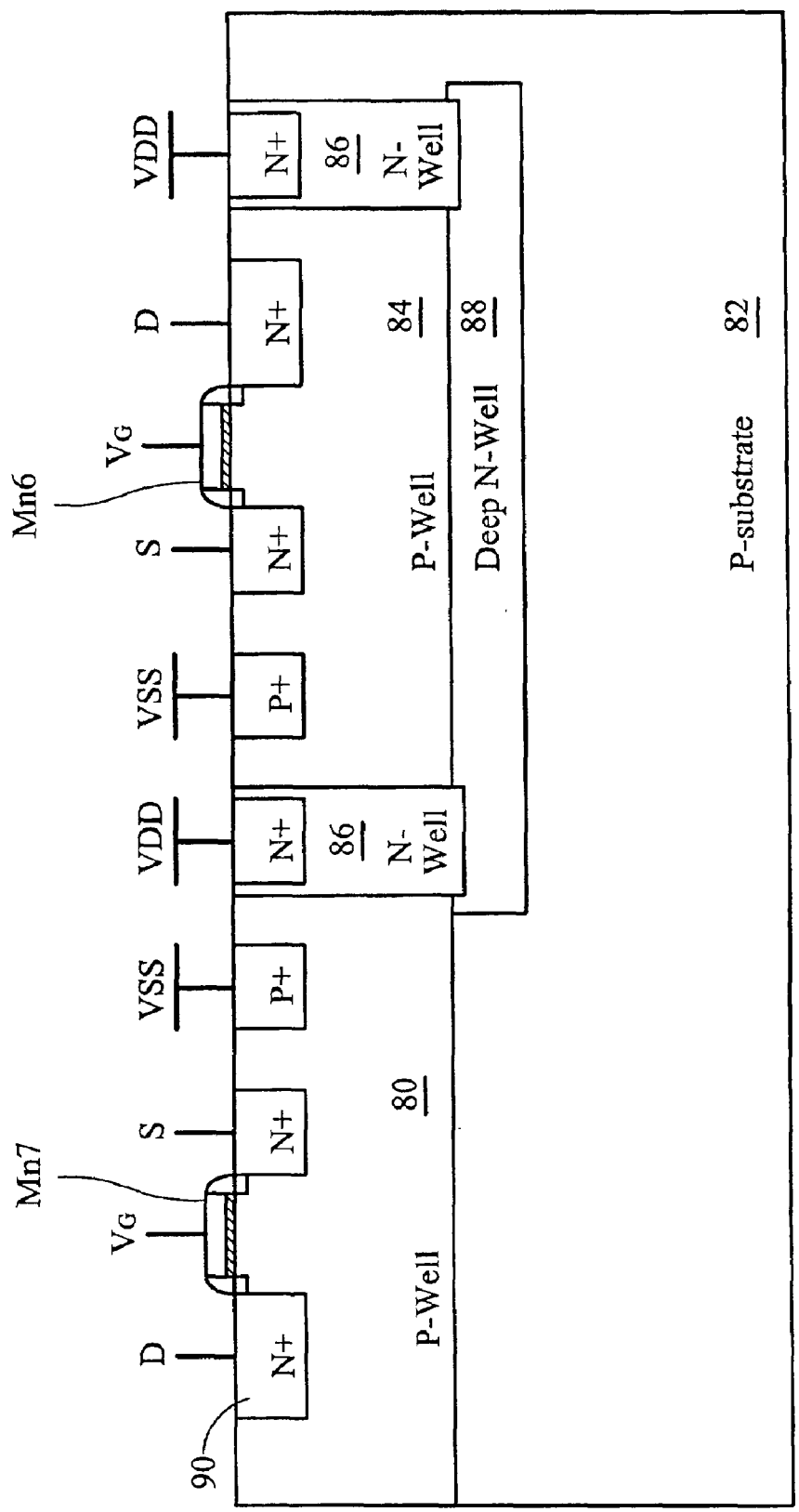
FIG. 10 is a cross-section of the NMOS Mn6 and Mn7 in FIGS. 8 and 9.
Figure 11:
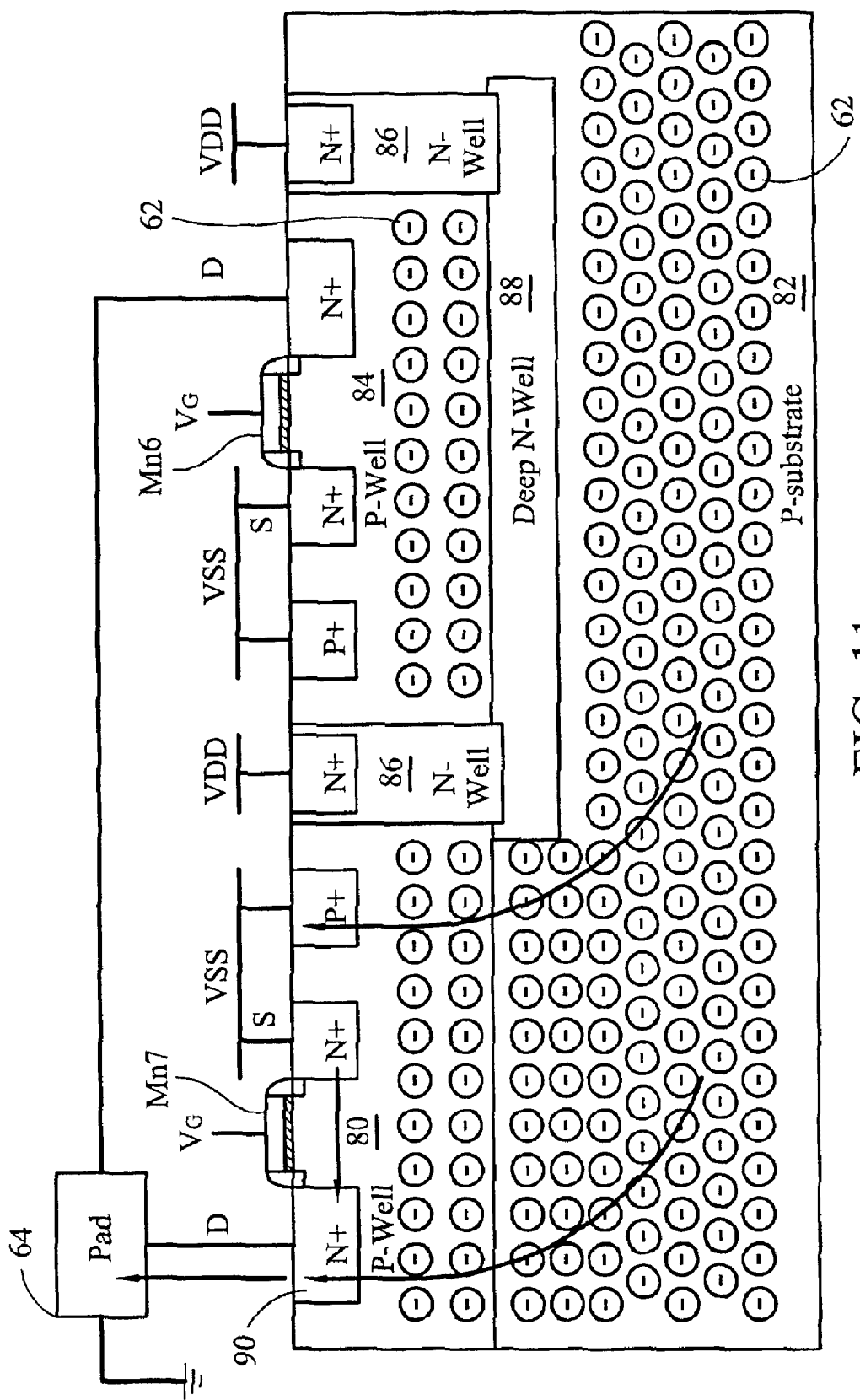
FIG. 11 shows the schematic electrostatic discharge path of the CDM charges in FIG. 10.

Cross-sections of Mn6 and Mn7 are shown in FIG. 10. Mn7 is formed in a P-well 80 connected to the common P-substrate 82. Mn6 is placed in a stand-along P-well 84 surrounded by a normal N-well 86 at the side and a deep N-well 88 at the bottom to be isolated from the common P-substrate 82. If the CDM charges stored in the P-substrate 82 are discharged via Mn6 component, the discharge path is: the P-substrate 82, the deep N-well 88, the stand-along P-well 84 and Mn6 component. The P-N junction between the P-substrate 82 and the deep N-well 88 or between the deep N-well and the stand-along P-well 84 has a great breakdown voltage of 20~40V in the general deep sub-micron CMOS technologies. If the CDM charges stored in the P-substrate 82 are discharged from Mn7, the discharge path is: the P-substrate 82, the p-well 80 and Mn7 component. The breakdown voltage of the P-N junction between the P-well 80 and the N+ diffusion drain 90 is only about 8~15V in the general deep sub-micron CMOS technologies. Therefore, the CDM charges stored in the P-substrate 82 are discharged from the ESD clamp component Mn7 rather than the functional component Mn6. The CDM charges and the discharge path thereof (by bold line) are shown in FIG. 11. Although the stand-along P-well 84 has some CDM charges 62, the amount of the CDM charges 62 in the stand-along P-well 84 of Mn6 is much smaller than those stored in the common P-substrate 82. The stand-along P-well 84 has a junction depth of about ~2 μm, but the P-substrate 82 has a thickness of 500~600 μm. The stand-along P-well 84 has a much smaller silicon area compared to the whole P-substrate 82 of the chip. Therefore, the CDM charges in the P-substrate 82 have a much greater amount than those in the stand-along P-well 84. By using the deep N-well structure, the CDM charges are mostly stored in the P-substrate 82, which is discharged through the ESD clamp component Mn7 to the pad 64 as shown in FIG. 11.

Figure 12:
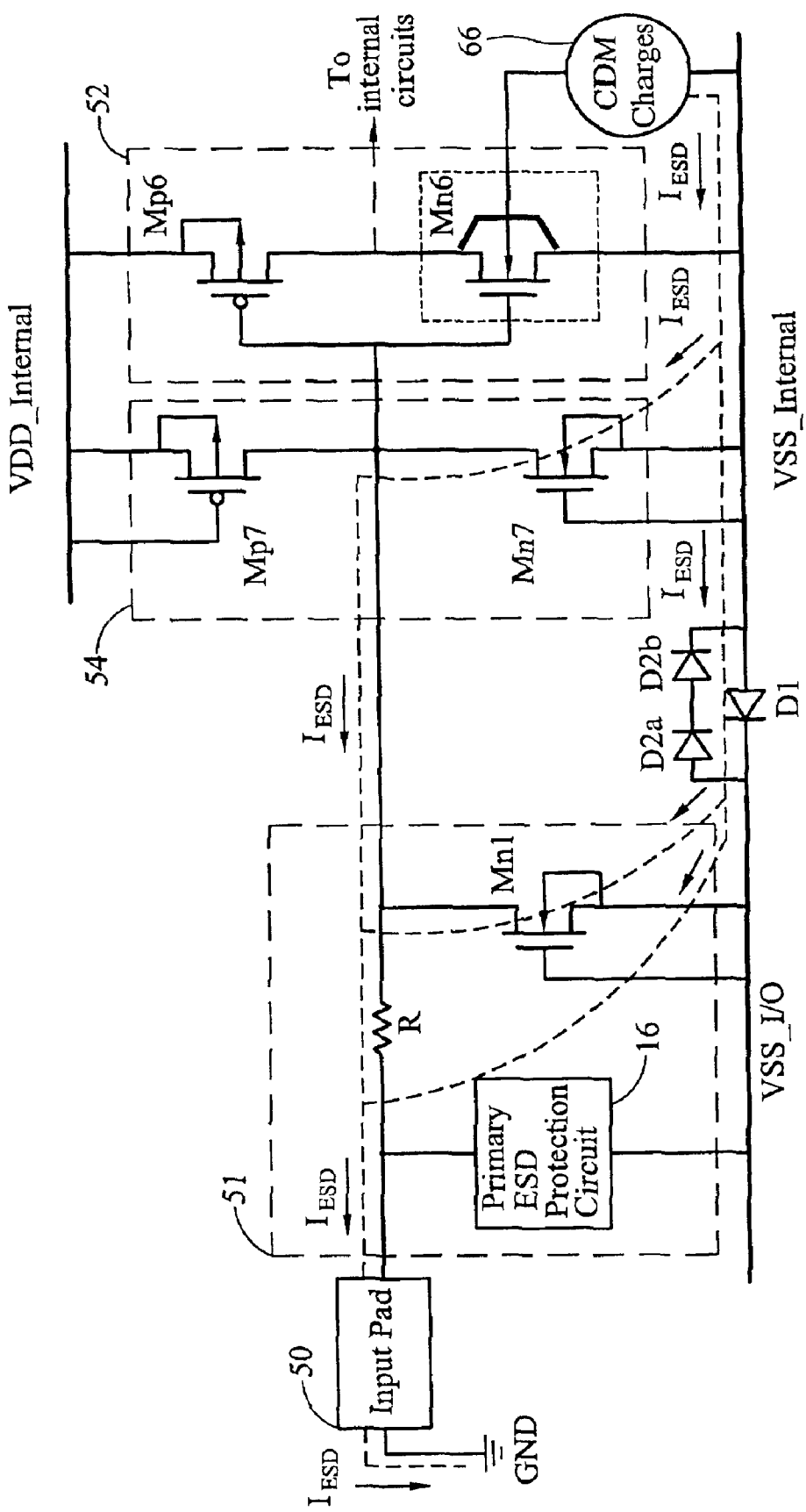
FIG. 12 shows the ESD protection function of the input port in FIG. 8.

The CDM ESD discharge current path of the input ESD protection device in FIG. 8 is shown in FIG. 12. The CDM charges 66 are discharged through Mn7 in the ESD clamp device 54 or through the HBM/MM ESD protection circuit 51 to the input pad 50 to protect Mn6 in the input buffer 52. As the dotted lines shown in FIG. 12, part of the CDM charges are conducted through the diodes (D1, D2a and D2b) from VSS_internal to the VSS_I/O power lines, and through the HBM/MM ESD protection circuit 51 to the grounded input pad 50. The diodes (D1, D2a and D2b) between VSS_internal to the VSS_I/O power lines help to conduct the current away from the internal circuits. Thus, the diode circuit (D1, D2a and D2b) increases the ESD-sustained level of the input circuits in a chip. The number of the diodes connected between the VSS_internal and the VSS_I/O power lines is not limited to that shown in the present invention, and the diodes are arranged to be connected in series as shown in FIG. 12.

Figure 13:
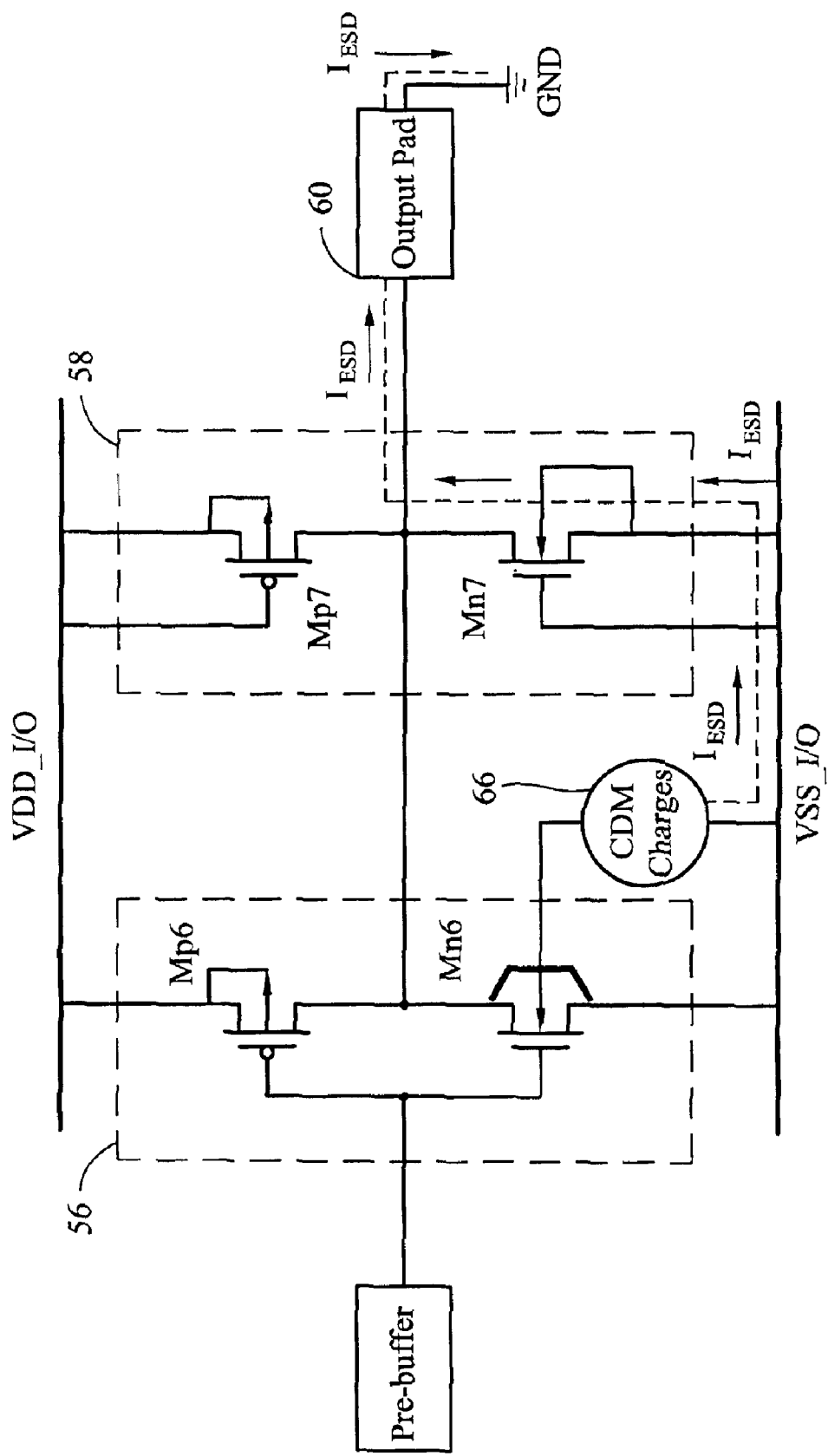
FIG. 13 shows the ESD protection function of the output port in FIG. 9.

In FIG. 13, the output ESD protection design of the present invention, the functional component Mn6 of the output driver 56 has the deep N-well structure, but the ESD clamp component Mn7 does not have the deep N-well structure. The CDM charges 66 in the P-substrate are thus discharged to the grounded output pad 60 through Mn7 in the ESD clamp device 58, as the dashed line shown in FIG. 13. By utilizing the present invention, Mn6 component of the output driver 56 is effectively protected against the CDM ESD events.

Figure 14:
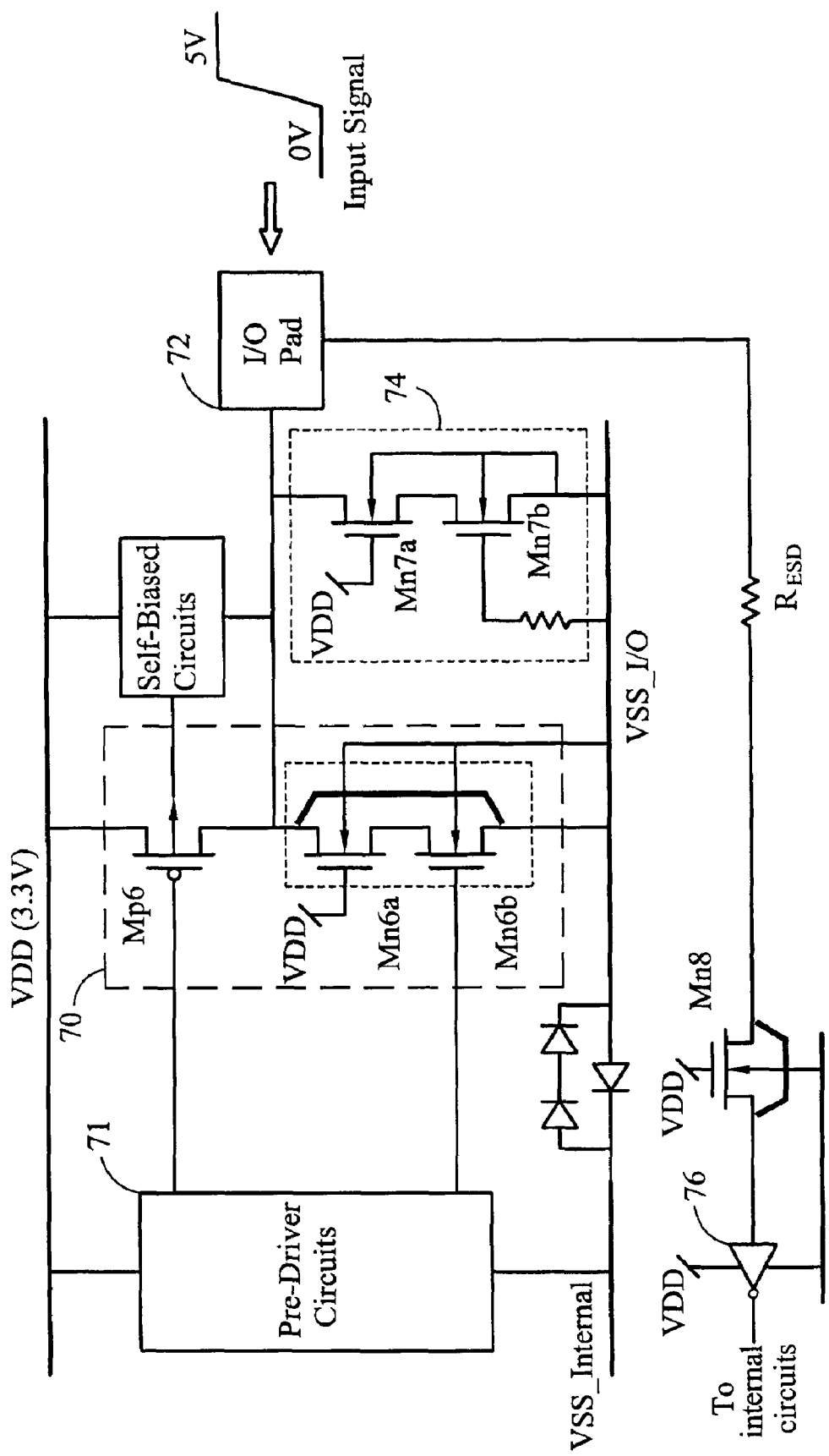
FIG. 14 shows an ESD protection design for a 3V/5V-tolerant I/O circuit of the present invention.

The proposed CDM ESD protection design with deep N-well structure can also be applied to a mixed-voltage circuit. A typical 3V/5V-tolirant I/O circuit is shown in FIG. 14 with the proposed CDM ESD protection design of the deep N-well structure. The PMOS Mp6 of the output driver 70 is formed in a self-based N-well (not shown in FIG. 14) not directly biased at VDD of 3.3V. To avoid voltage overstress across NMOS gate oxide of the output driver 70, the NMOS Mn6a and Mn6b of the output driver 70 are configured in a stack. As shown in FIG. 14, the gate of Mn6a is coupled to VDD of 3.3V, and the gate of Mn6b is controlled by the pre-driver circuits 71 to avoid the gate oxide overstress problem. The source of Mn6b is coupled to the VSS_I/O power line. To meet the sustained voltage level and to avoid the direct gate-oxide overstress problem, the components Mn7a and Mn7b of the ESD clamp device for the 3V/5V-tolerant I/O circuit are also formed in stack as shown in FIG. 14. Additionally, in order to avoid the gate-oxide overstress of the input buffer 76, an NMOS Mn8 is coupled between the I/O pad 72 and the input buffer 76. The gate of Mn8 is connected to VDD of 3.3V to clamp the voltage sent to the input buffer 76. When the input signal has a voltage level 5V, the voltage received by the input buffer 76 will remain at VDD (3.3V), hence preventing the overstress problem.

To improve the CDM ESD level in a more complex design, such as the mixed-voltage I/O circuit, the deep N-well structures are added to the functional components to block their P-well regions away from the common P-substrate. The application of this invention on the 3V/5V-tolerant I/O circuit is shown in FIG. 14, wherein the P-well regions of Mn6a and Mn6b are surrounded by the deep N-well structure at the bottom and by the normal N-well at the side. The P-well of the transmission-gate Mn8 is also surrounded by a deep N-well structure at the bottom side and by a normal N-well at the edge side. The deep N-well structures of Mn6a, Mn6b and Mn8 are biased at VDD of 3.3V to block the leakage current of the P-well of the three from the common P-substrate. With the deep N-well structure in FIG. 14, the CDM charges stored in the common P-substrate are discharged through the desired ESD clamp devices Mn7a and Mn7b to the grounded I/O pad 72 in the CDM ESD events. Therefore, the functional components Mn6a, Mn6b and Mn8 can be effectively protected by the desired ESD clamp devices.

Figure 15:
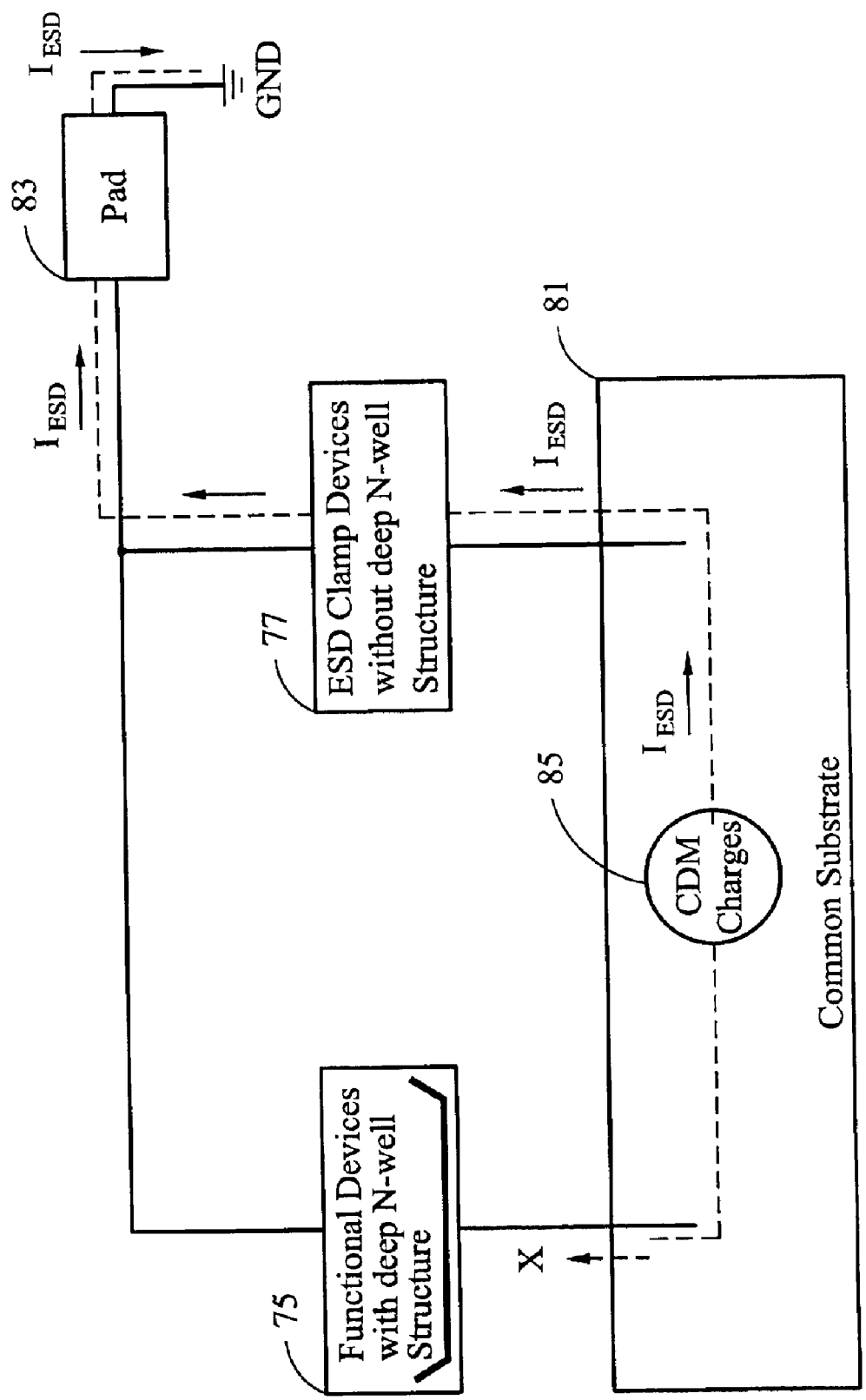
FIG. 15 shows the schematic diagram of the basic design concept of the present invention.

The proposed CDM ESD protection method is illustrated in FIG. 15 to show the general design concept. In FIG. 15, the deep N-well structure is used to surround the functional devices 75 such as the input buffer or the output driver which transmits signals during normal operation. There is no deep N-well structure in the ESD clamp devices 77. The breakdown-voltage difference between the two discharge paths allows the CDM charges 85 stored in the common substrate to discharge through the desired ESD clamp devices 77 to the grounded pad 83, not through the functional devices 75. Hence, the functional devices 75 are protected from CDM ESD events. At the same time, the IC is also protected from HBM/MM ESD events through the ESD clamp devices 77.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A charged-device model (CDM) electrostatic discharge (ESD) protection circuit for an integrated circuit (IC), the ESD protection circuit comprising:

an ESD clamp device, coupled to a pad and a substrate having a first conductivity type, the ESD clamp device being closed under normal power operation; and a functional component, formed on the substrate and coupled to the pad, the functional component comprising a first well of the first conductivity type, an active element disposed in the first well and an isolating region of a second conductivity type, the second conductivity type being the reversed polarity of the first conductivity type, and the isolating region isolating the first well from the substrate; the functional component transmitting signals between the IC and an external linkage under normal power operation.

2. The CDM ESD protection circuit in claim 1, wherein the isolating region comprises a second well surrounding the first well and a deep well under the first well.

3. The CDM ESD protection circuit in claim 1, wherein the isolating region is coupled to a first power supply and the first well is coupled to a second power supply.

4. The CDM ESD protection circuit in claim 1, wherein the functional component comprises a metal-oxide semiconductor (MOS) having the second conductivity type in the first well.

5. The CDM ESD protection circuit in claim 1, wherein the ESD clamp device comprises an MOS diode having two ends respectively coupled to the pad and the substrate.

6. The CDM ESD protection circuit in claim 1, wherein the ESD clamp device is a two-stage ESD protection circuit, having a primary ESD protection circuit coupled between the pad and the substrate, a secondary ESD protection circuit coupled between the functional component and the substrate, and a resistor coupled between the functional component and the pad.

7. The CDM ESD protection circuit in claim 1, wherein the first conductivity type is an N type, and the second conductivity type is p type.

8. The CDM ESD protection circuit in claim 1, wherein the first conductivity type is a p type, and the second conductivity type is N type.

9. A charged-device model (CDM) electrostatic discharge (ESD) protection circuit for an input port of an integrated circuit (IC), the ESD protection circuit comprising:

an ESD clamp device, coupled to a pad and a substrate having a first conductivity type, under normal power operation, the ESD clamp device being closed; and an MOS component having a second conductivity type, formed in a first well on the substrate and coupled to the pad; an isolating region having the second conductivity type being formed between the first well and the substrate to separate the first well and the substrate, the second conductivity type being the reversed polarity of the first conductive type, and under normal power operation, the MOS component transmitting signals from the pad into the IC.

10. The CDM ESD protection circuit in claim 9, wherein a gate of the MOS component is coupled to the pad.

11. The CDM ESD protection circuit in claim 9, wherein the source of the MOS component is coupled to an internal power line.

12. The CDM ESD protection circuit in claim 11, wherein the CDM ESD protection circuit further comprises an ESD protection circuit coupled between the gate of the MOS component and the internal power line.

13. The CDM ESD protection circuit in claim 12, wherein the ESD protection circuit at the input port is an gate-grounded MOS component.

14. The CDM ESD protection circuit in claim 11, wherein the first well is coupled to the internal power line.

15. A charged-device model (CDM) electrostatic discharge (ESD) protection circuit for an output port of an integrated circuit (IC), the ESD protection circuit comprising:

an ESD clamp device, coupled to a pad and a substrate having the first conductivity type, under normal power operation, the ESD clamp device being closed; and an MOS component having a second conductivity type, formed in a first well on the substrate and coupled to the pad; an isolating region having the second conductivity type being formed between the first well and the substrate to separate the first well and the substrate, the second conductivity type being the reversed polarity of the first conductive type, and under normal power operation, the MOS component transmitting signals from the IC to the pad.

16. The CDM ESD protection circuit in claim 15, wherein a drain of the MOS component is coupled to the pad, a source of the MOS component and the first well are coupled to an I/O power line.

17. The CDM ESD protection circuit in claim 15, wherein a plurality of diodes are disposed between the I/O power line and an internal power line.

18. A CDM ESD protection circuit, suitable for an I/O port of a high voltage IC, the COM ESD protection circuit comprises:

an ESD clamp device, coupled between a pad and a p-type substrate, the ESD clamp device being closed under normal power operation; and a first NMOS (N-type metal-on-semiconductor) component formed on a P-type first isolated well on the substrate, an N-type isolating region being formed to separate the P-type first isolated well and the substrate; the NMOS component having a gate coupled to a high power line, a first source/drain coupled to the pad, and a second source/drain coupled to an input buffer; and an output driver comprising a second and a third NMOS component respectively formed in a P-type second isolated well on the substrate and connected in series; an N-type second isolating region formed between the P-type second isolated well and the substrate, a gate of the second NMOS component, coupled to the high Power line, a drain of the second NMOS component coupled to the pad, a source of the second NMOS component coupled to a drain of the third NMOS component, a source of the third NMOS component coupled to an I/O low power line, and a gate of the third NMOS component being to a pre-output driver.

19. The CDM ESD protection circuit in claim 18, wherein the first isolated well is coupled to an internal low power line, the second isolated well is coupled to the I/O low power line.

20. The CDM ESD protection circuit in claim 19, wherein a plurality of diodes are disposed between the internal low power line and the I/O low power line.

21. The CDM ESD protection circuit in claim 18, wherein the ESD clamp device comprises a forth NMOS component and a fifth NMOS component, connected in series between the pad and I/O low power line, a gate of the forth NMOS component is coupled to the high power line, and a gate of the fifth NMOS component is coupled to the I/O low power line.

22. The CDM ESD protection circuit in claim 18, wherein an ESD protection resistor is formed between the first NMOS component and the pad.

* * * * *